United States Patent [19]

Stanojevic

[11] Patent Number: 4,692,688

[45] Date of Patent: Sep. 8, 1987

[54] ZERO STANDBY CURRENT SWITCH METHOD AND APPARATUS

[75] Inventor: Silvo Stanojevic, Milpitas, Calif.

[73] Assignee: National Semiconductor Corporation, Santa Clara, Calif.

[21] Appl. No.: 806,738

[22] Filed: Dec. 9, 1985

[51] Int. Cl.[4] .................................................. G05F 1/56
[52] U.S. Cl. ..................................... 323/285; 323/901
[58] Field of Search .............................. 323/282–285, 323/289, 901; 361/87, 88, 90–93

[56] References Cited

U.S. PATENT DOCUMENTS

| | | | |
|---|---|---|---|
| 4,340,851 | 7/1982 | Nishikawa | 323/901 X |
| 4,476,428 | 10/1984 | Iwasawa et al. | 323/901 X |
| 4,566,060 | 1/1986 | Hoeksma | 323/289 X |
| 4,574,232 | 3/1986 | Petty | 323/901 X |

Primary Examiner—Peter S. Wong
Attorney, Agent, or Firm—Gail W. Woodward

[57] ABSTRACT

A bipolar switch is disclosed having a near zero standby current characteristic, low output impedance in the "on" state, and near infinite impedance in the "off" state. The switch is responsive to a control signal to apply regulated power to a load. The switch includes a turn-on detect circuit which is powered solely from the control signal, and switching circuitry which is powered from a power source but which normally draws no standby current when the switch is in its "off" state. The switching circuitry includes speed-up circuitry to permit rapid turn-on, circuitry which employs positive feedback to achieve high current gain, and circuitry for rapidly turning off the switch.

21 Claims, 9 Drawing Figures

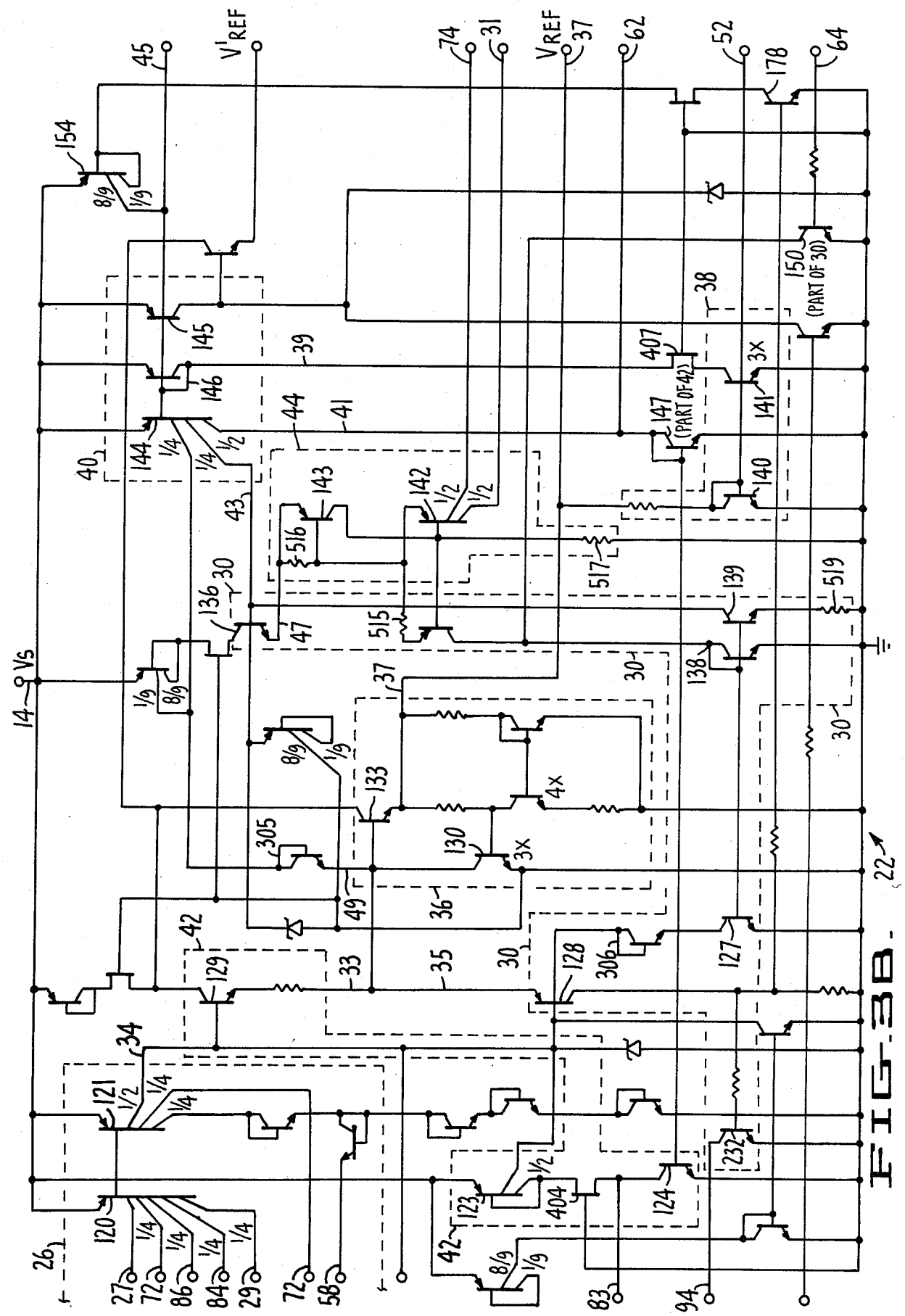

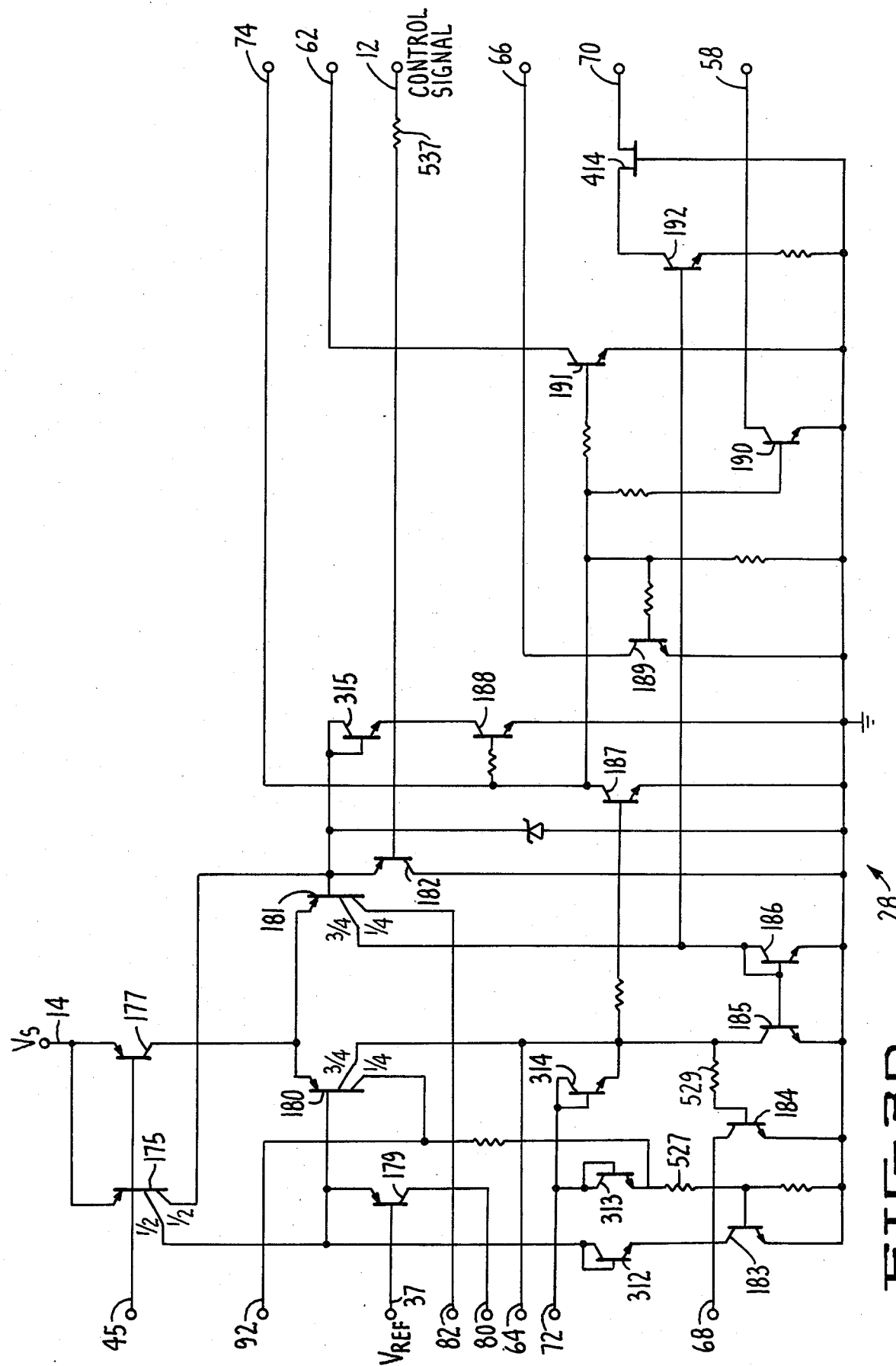

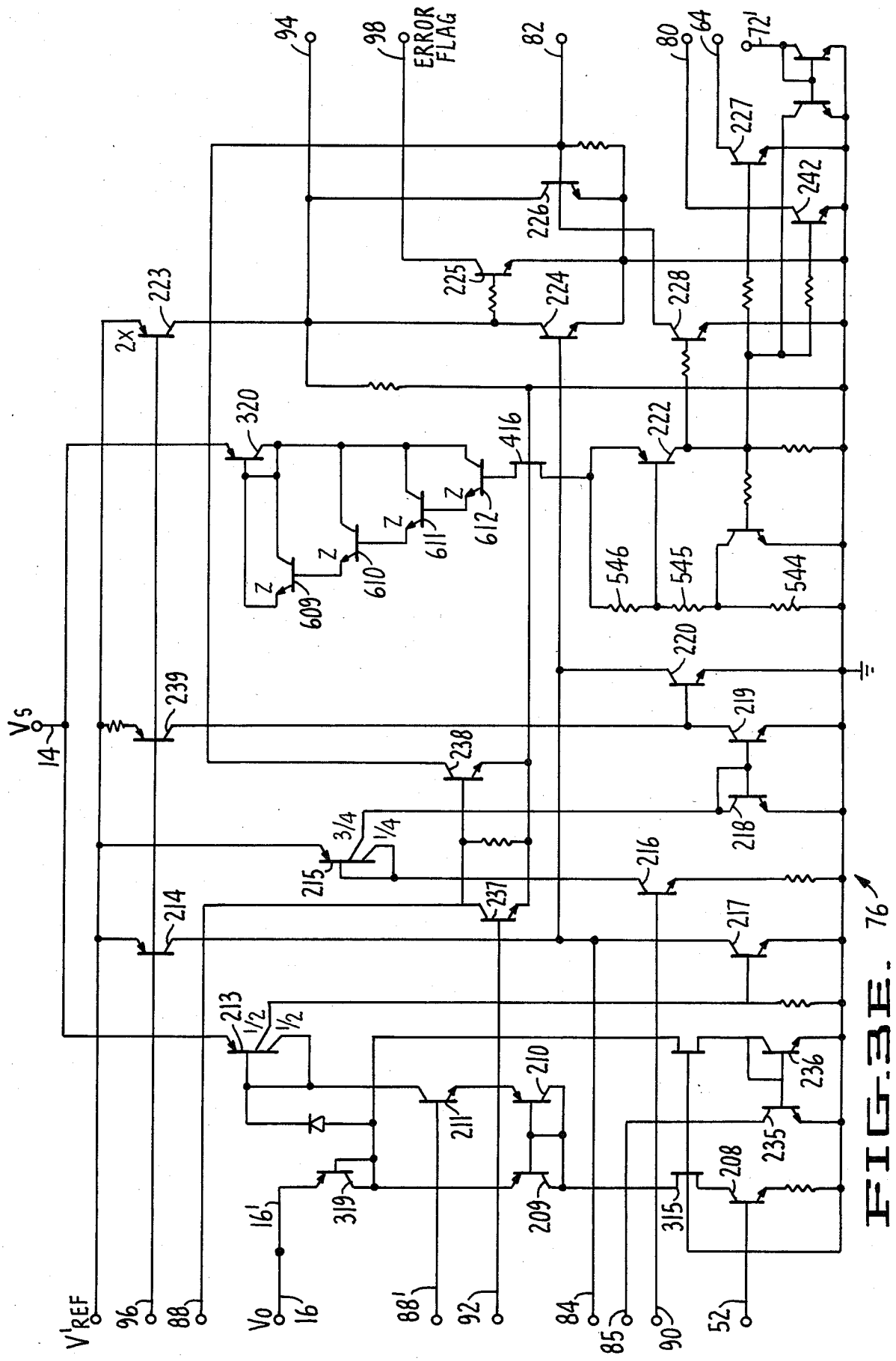

4,692,688

ZERO STANDBY CURRENT SWITCH METHOD AND APPARATUS

TECHNICAL FIELD

The present invention is generally related to switches and more particularly to a fast monolithic switch which requires no quiescent bias current in its off state.

BACKGROUND ART

The controlled application and removal of power to loads, such as electronic circuitry, can be performed in a multiplicity of different ways. Mechanical switches require that the user physically move electrical contacts in the switch to connect the power source to the load. Electromechanical relays respond to an electronic control signal supplied by the user to close a set of contacts so as to connect power to the load. While such mechanical and electromechanical configurations exhibit certain ideal switch characteristics, such as near infinite "off" impedance, near zero "on" impedance, and zero quiescent current, they suffer from certain disadvantages such as susceptibility to mechanical failure, the requirement of control signals of moderate power, slow response time, switch bounce, and degradation in performance after a certain number of on/off cycles.

A number of solid state switches are presently available in both bipolar and MOS or DMOS technologies. While the MOS type switches feature low quiescent currents, they suffer from a lack of speed, for example switching times of 30 to 50 microseconds. While these speeds are an improvement over the mechanical and electromechanical switch technologies, they are still too slow for some applications.

Present bipolar switches are fast, having for example 1 microsecond switching times, but require significant standby or quiescent currents. The existing bipolar switch technology can be modified by conventional approaches to operate at lower quiescent currents. However, with such conventional approaches, speed is sacrificed; i.e. the switching speeds of such modified bipolar devices will be on the order of MOS device switching speeds.

Advantages of solid state switches include the absence of mechanical type failures, the requirement of lower level control signals, and potentially smaller physical size.

It would therefore be highly desirable to have a solid state bipolar switch having fast switching times and low or no standby current requirements, in addition to infinite impedance in its "off" state and zero impedance in its "on" state.

SUMMARY OF THE INVENTION

The foregoing and other problems of prior art switches are overcome by the present invention of a solid state apparatus responsive to a control signal for supplying power from a power source to a load comprising detect means coupled to receive the control signal for detecting the presence of a turn on state in the control signal and for generating an actuate signal in response thereto, wherein initially said detect means are powered solely from the control signal; and means powered from the power source, coupled between the power source and the load, and responsive to the actuate signal, for supplying power to the load, wherein said supplying means switches from an "off" state to an "on" state when said actuate signal is received, and further wherein said supplying means requires no quiescent bias current in the "off" state.

In an embodiment of the present invention, speed-up means are included which operate during turn-on of the supplying means to bring the supplying means rapidly into operation.

In the preferred embodiment of the present invention the supplying means include a reference section and a control section, the reference section supplying reference signals to the control section, and the control section controlling the application of power to the load from the power source. The reference section employs a self-sustaining design which operates after the initial turn on of the section by the speed-up signal, to maintain the sections in an operating condition. The control section employs positive feedback to boost the output current capacity of the switch, and negative feedback to provide stability.

The preferred embodiment of the present invention further includes means responsive to a turn-off state in the control signal to deactivate the switch. Further included are a delay circuit which operates during the deactivation of the switch to supply power to the reference section for a short period of time. This is to permit discharging circuitry in the regulator section to force the output of the regulator into an "off" condition in a rapid and predictable manner.

Further included are error detection circuitry to detect faults in the operation of the switch.

In accordance with the method of the present invention, a bipolar switch is implemented by providing a turn-on detect circuit powered solely from a control signal for detecting the presence of a turn-on state in the control signal, and actuating connecting circuitry into an operative state, wherein the connecting circuitry applies the power to the load. The connecting circuitry is of the type which requires no standby current in the "off" state. The actuating step can include the steps of issuing speed-up signals to the connecting circuitry to rapidly place the circuitry into an operating condition.

In one embodiment of the method of the present invention, positive feedback is employed in the connecting circuitry to boost output current levels, and self-sustaining circuitry is employed to keep the connecting circuitry operational following the actuating step. The use of positive feedback increases the efficiency of the bipolar switch by reducing the minimum bias signal required in the connecting circuitry to obtain the desired output current levels.

A further enhancement of the method of the present invention includes the step of providing discharge circuitry and delay circuitry to permit the discharging of components during the turn off mode of the switch, which components handle high currents in the connecting circuitry. In this manner, such components can be brought more rapidly and completely into an "off" condition.

It is therefore an object of the present invention to provide a bipolar switch having high switching speeds and very low quiescent or standby current requirements.

It is another object of the present invention to provide a bipolar switch having zero quiescent current requirements.

It is still another object of the present invention to provide a bipolar switch which employs positive feedback circuitry to actuate portions of the switch rapidly, from a standby mode in which such portions are completely "off," into an "on" state.

It is another object of the present invention to provide a solid state switch having substantially low impedance in its "on" state, and substantially infinite impedance in its "off" state.

It is still another object of the present invention to provide a solid state switch which utilizes positive feedback to boost output current levels after it has been actuated by a control signal.

It is a further object of the present invention to provide a bipolar switch which employs speed up signals to bring portions which are normally "off" rapidly into operation.

It is a still further object of the present invention to provide a bipolar switch which includes turn off circuitry for rapidly discharging components of the switch during the turn off of the switch, and turn off delay circuitry to provide power to the turn off circuitry during the discharging of the switch components.

These and other objectives, features and advantages of the present invention will be more readily understood upon consideration of the following detailed description of certain preferred embodiments of the present invention and accompanying drawings.

BRIEF DESCRIPTION OF THE DRAWINGS

FIG. 3B is a detailed schematic of reference circuitry of the present invention.

FIG. 3D is a detailed schematic of turn-off detector circuitry of the present invention FIG. 3E detailed schematic of error flag circuitry of the present invention.

DETAILED DESCRIPTION OF THE PREFERRED EMBODIMENT

Figure 1:
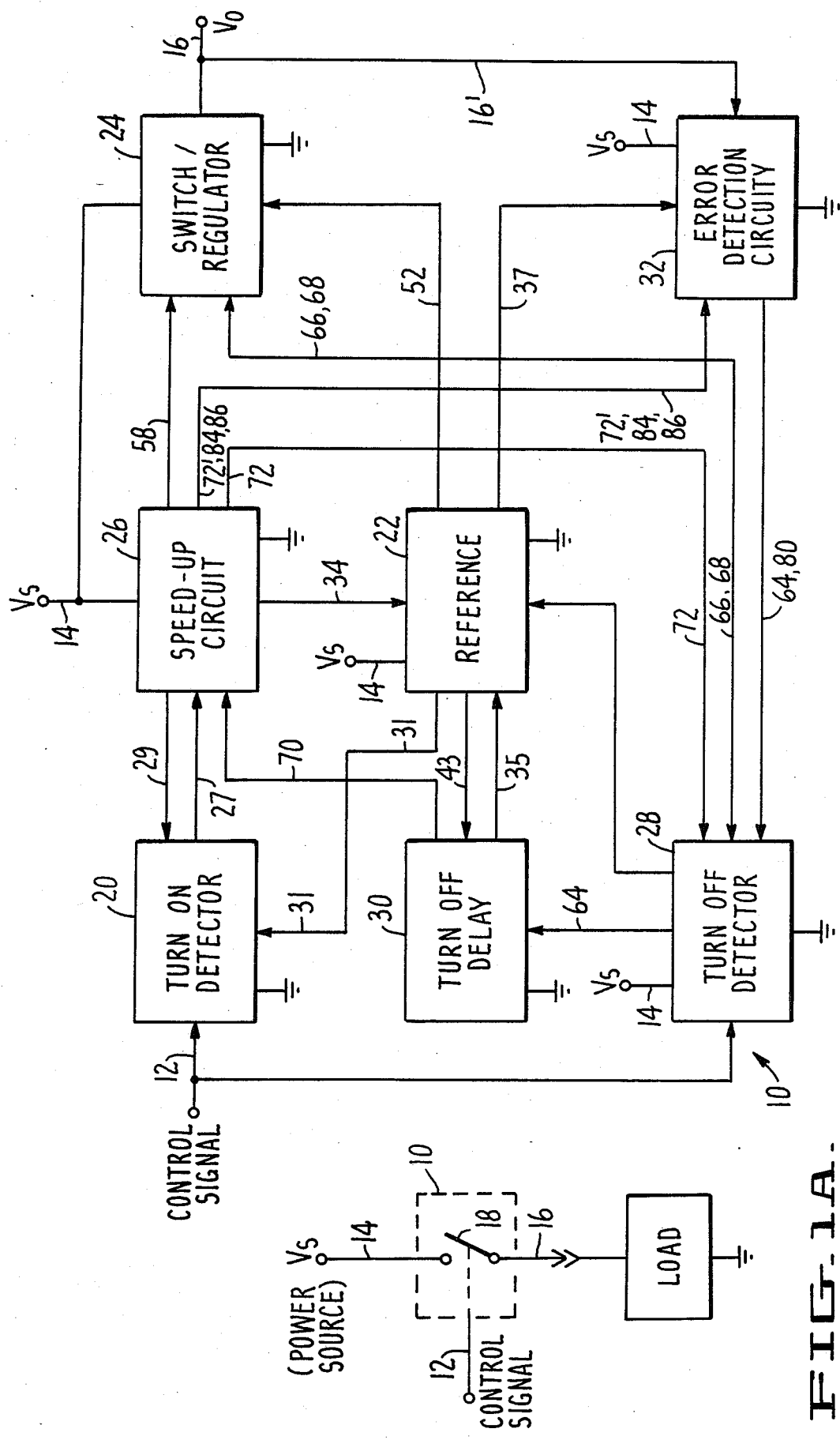
FIG. 1A is a symbolic depiction of the present invention.
FIG. 1B is a simplified block diagram of the present invention.

Referring to FIG. 1A, a symbolic functional depiction of the bipolar switch of the present invention is illustrated. The switch 10 is responsive to a control signal applied at terminal 12. The power source is connected to terminal 14, while the power to be applied to the load is provided at terminal 16. The control signal causes terminal 14 to be coupled to terminal 16 by causing signal path 18 to be closed.

Referring to FIG. 1B, a preferred embodiment of the present invention functionally includes TURN ON DETECT circuitry 20, REFERENCE circuitry 22, SWITCH/REGULATOR circuitry 24, SPEED UP circuitry 26, TURN OFF DETECT circuit 28, TURN OFF DELAY circuitry 30, and ERROR DETECTION circuitry 32. The control signal is applied to TURN ON DETECT circuit 20 via terminal 12. The control circuit is also supplied to TURN OFF DETECT circuit 28 via the same terminal.

It is to be noted that TURN ON DETECT circuit 20 initially derives its power solely from the control signal at terminal 12. It is also to be noted that the remaining blocks of circuitry derive their power from the power source, in this example $V_s$, applied at terminal 14.

It is to be noted that in the quiescent state of the switch, blocks 22 through 32 are preferably entirely "off." That is, in the "off" state of the switch 10, they do not draw any current from the power source other than leakage current. It is only after TURN ON DETECT circuitry 20 detects the presence of a turn-on state in the control signal at terminal 12 that blocks 22 through 32 are activated and become operational.

In operation, when the turn-on state is detected, TURN ON DETECT circuitry 20 activates SPEED UP circuit 26. In turn, SPEED UP circuit 26 sends speed-up signals to REFERENCE circuitry 22, switch circuitry 24, TURN OFF DETECT circuit 28, and ERROR DETECTION circuitry 32. SPEED UP circuitry 26 returns a speed-up signal to TURN ON DETECT circuit 20 to cause it to be latched in an "on" state. Concurrently, TURN OFF DELAY circuitry 30 is initialized to receive a signal from TURN OFF DETECT circuit 28. At this time, SWITCH/REGULATOR 24 provides an output signal $V_{out}$ to the load. The switch 10 remains in this state until ERROR DETECTION circuitry 32 determines that a fault has occurred or until TURN OFF DETECT circuit 28 detects a turn-off state at terminal 12.

When the switch is in an "on" state, TURN ON DETECT circuit 20 will be nonresponsive to a turn-off state at terminal 12, since it is latched in an "on" mode. However, TURN OFF DETECT circuit 28 will respond to the turn-off state and send turn-off signals to the SWITCH/REGULATOR circuitry 24 and TURN OFF DELAY circuitry 30. In response to the turn-off signals, SWITCH/REGULATOR circuitry 24 will turn off and TURN OFF DELAY circuitry 30 will initiate a turn-off procedure in REFERENCE circuitry 22.

TURN OFF DELAY circuit 30 assures that the switch will turn off quickly by maintaining power for use by discharging circuitry in the SWITCH/REGULATOR 24 so that components having long turn off times can be actively turned off. Upon the expiration of a preset delay time in the TURN OFF DELAY circuit 30, every block will be turned off. At that time the conditions of every block will be identical to that at the beginning of the cycle.

When a fault occurs, the ERROR DETECTION circuitry will signal TURN OFF DETECT circuit 28. The TURN OFF DETECT circuit 28 will respond thereto in a manner similar to its response when it detects a turn-off state at terminal 12.

Generally, REFERENCE circuitry 22, when operational, provides reference signals including reference voltages and bias signals to be used by SWITCH/REGULATOR circuitry 24, TURN OFF DETECT circuit 28, ERROR DETECTION circuitry 32, and TURN OFF DELAY circuit 30. SWITCH/REGULATOR circuitry 24 receives the reference signals from REFERENCE circuitry 22 and in response thereto applies power to the load at terminal 16.

REFERENCE circuitry 22 includes a self-sustaining circuit which acts to maintain it in an operative condition after the speed-up signal from SPEED UP circuitry 26 is removed. Such a circuit is not self-starting; i.e. even though power is applied to the circuit, it will not turn on unless an activating signal is also supplied. However, once turned on, a self-sustaining circuit will stay turned on until power is removed or a deactivating signal is supplied.

SWITCH/REGULATOR circuitry 24 includes a positive feedback loop which boosts the output drive capability of the device in the presence of a low level output drive bias current, and a negative feedback loop which permits stable operation under various operating conditions.

The above self-sustaining and feedback circuits permit REFERENCE circuitry 22 and SWITCH/REGULATOR circuitry 24 to have an "off" state in which there is no requirement for standby or quiescent current.

TURN OFF DETECT circuit 28, as described above, detects the presence of a turn-off state at terminal 12. When such a signal is detected, TURN OFF DETECT circuit 28 applies a signal to REFERENCE circuitry 22 to defeat the self-sustaining capacity of the circuit. It also applies a signal to switch circuitry 24 which, in effect, defeats the positive feedback circuitry therein. These signals also initiate discharge circuitry by which the REFERENCE circuitry 22 and SWITCH/REGULATOR circuitry 24 are rapidly turned off.

Because solid state components, such as high-current handling components in SWITCH/REGULATOR circuitry 24, will often exhibit a nontrivial period of time over which turn-off occurs, discharging circuitry is useful in speeding up the turn off of such devices. TURN OFF DELAY circuit 30 operates to hold the REFERENCE circuitry 22 in an operative state for a predetermined time following receipt of the turn-off state from TURN OFF DETECT circuit 28. This permits the discharge circuitry within SWITCH/REGULATOR circuitry 24 to fully deactivate the high current handling elements therein.

ERROR DETECTION circuitry 32 monitors the signal conditions at terminal 16, the output of the switch of the present invention. The ERROR DETECTION circuitry provides an error flag when a fault is detected and, under certain circumstances, shuts down the switch. Among the faults detected are: (1) a short circuit of the output terminal 16 to ground, (2) a short circuit of the output terminal 16 to the power source, (3) a power source voltage which exceeds a designated voltage level, (4) over-heating of the switch, (5) current limit conditions, and (6) the absence of a load on output terminal 16.

Figure 2:
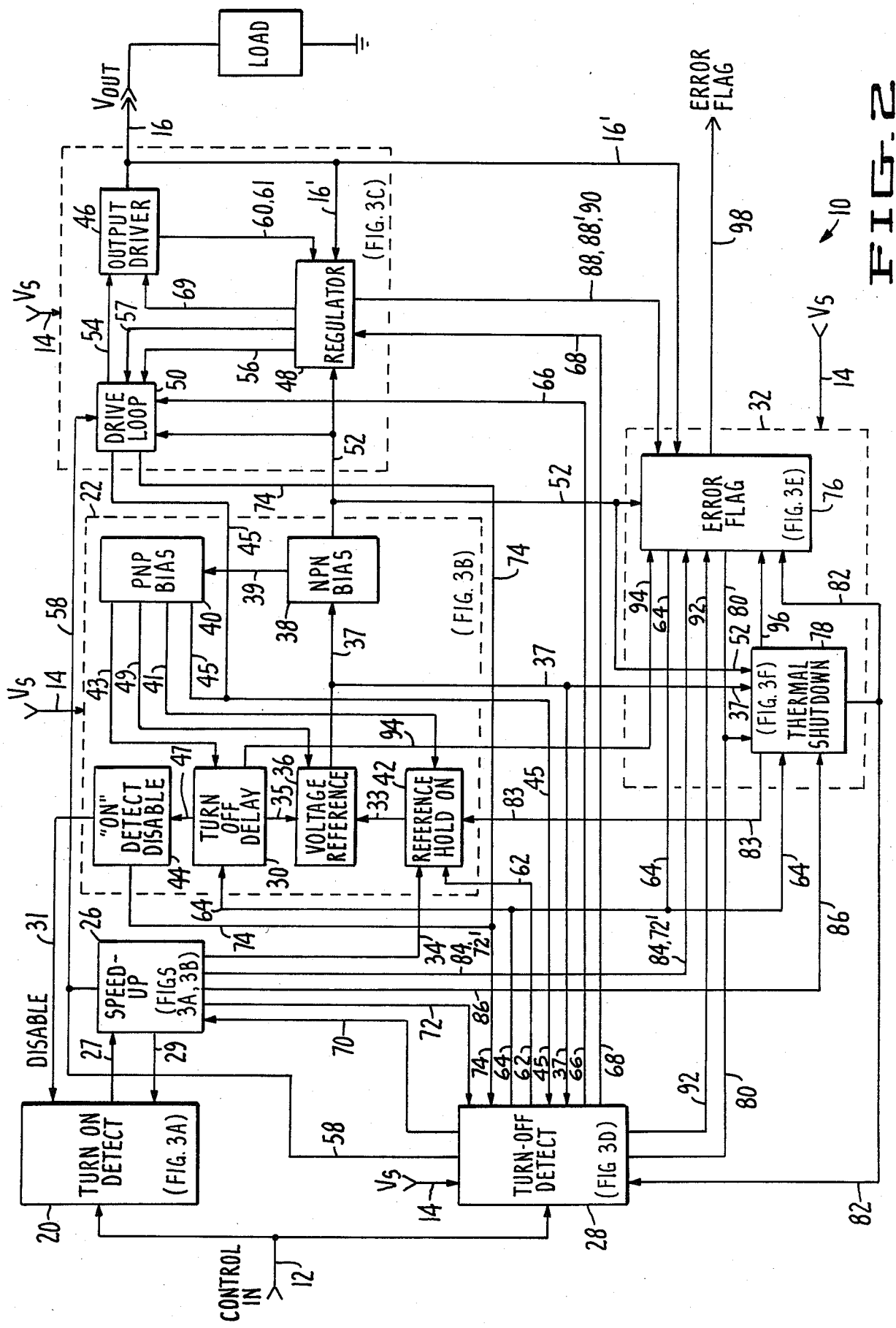
FIG. 2 is a more detailed block diagram of the present invention.

The bipolar switch 10 of the present invention will now be described in greater functional detail. FIG. 2 illustrates the distribution of the functional elements of the switch in the detailed schematics of FIGS. 3A through 3F in an effort to simplify the explanation of the operation of the bipolar switch of the present invention. A detailed schematic for TURN ON DETECT circuitry 20 is found in FIG. 3A while detailed schematics for SPEED UP circuit 26 and REFERENCE circuit 22 can be found in FIG. 3B. A detailed schematic for SWITCH/REGULATOR circuitry 24 can be found in FIG. 3C, while a detailed schematic for TURN OFF DETECT circuit 28 can be found in FIG. 3D. Finally, ERROR DETECTION circuitry 32 is provided in detail in FIGS. 3E and 3F.

TURN ON DETECT Circuit 20

Figure 3A:
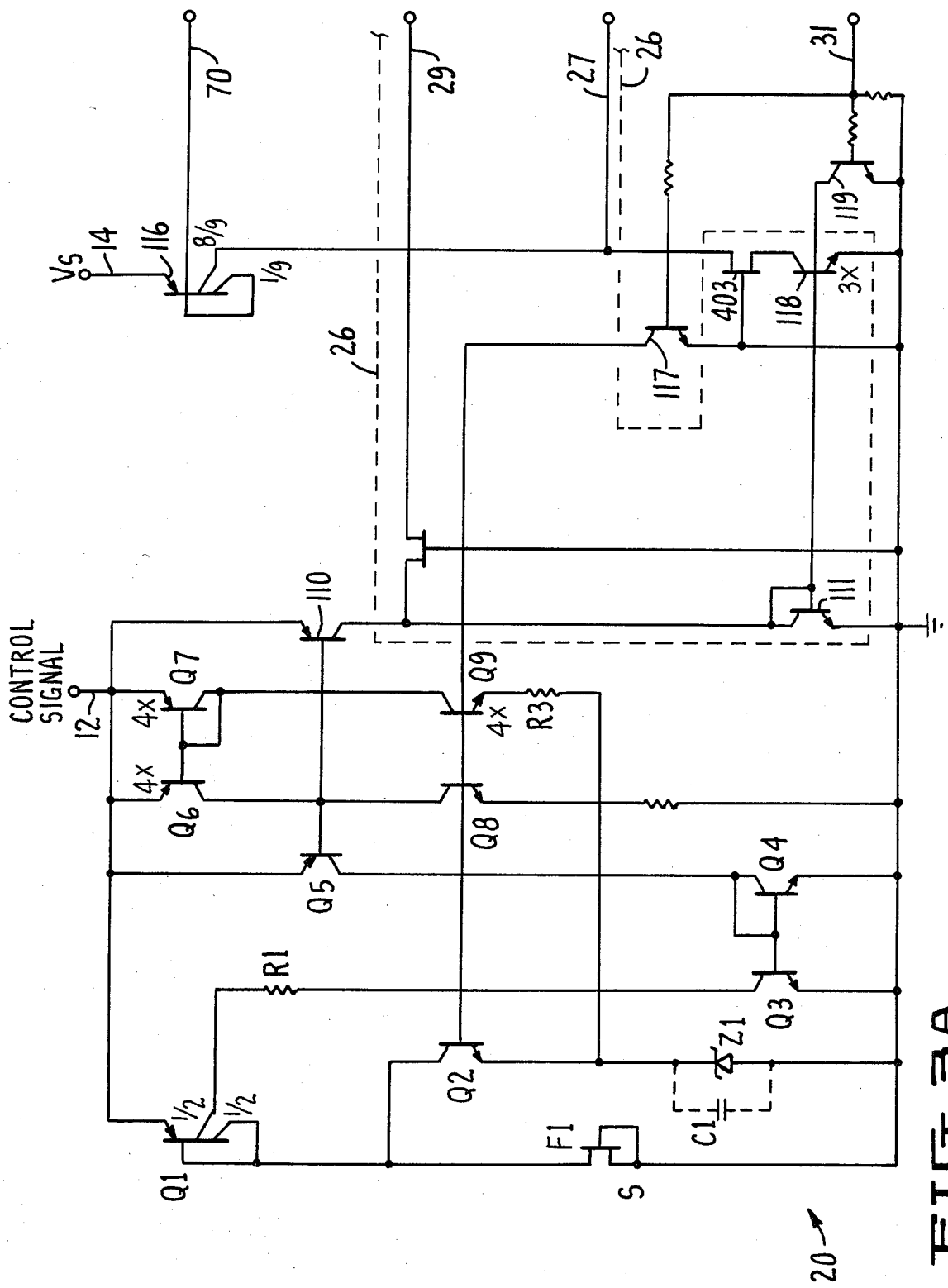
FIG. 3A is a detailed schematic of control signal detection circuitry of the present invention.

With respect to TURN ON DETECT circuitry 20, FIG. 3A, reference is made to copending U.S. patent application Ser. No. 806,982, filed even date herewith, entitled "Threshold Detector Circuit and Method" in which a detailed description of the operation of such circuitry is provided. To this extent, the above referenced copending application is incorporated by reference herein.

As discussed above, the TURN ON DETECT circuitry 20 detects the presence of a turn-on state in the control signal applied to terminal 12 and activates SPEED UP circuitry 26. SPEED UP circuitry 26 responds by providing speed-up signals to the remainder of the blocks in the bipolar switch, and also returns a speed-up signal to the TURN ON DETECT circuitry 20. This signal is utilized in a positive feedback manner to latch the TURN ON DETECT circuit 20 into an "on" state, which state is independent of the signal at terminal 12.

After a short period of time, during which REFERENCE circuitry 22 becomes operational, the REFERENCE circuitry 22 supplies a disable signal to TURN ON DETECT circuit 20. This signal disables TURN ON DETECT circuitry 20 and prevents it from responding to any control signal at terminal 12 so long as the disable signal is supplied from REFERENCE circuitry 22.

REFERENCE Circuitry 22

Referring now to the REFERENCE circuitry 22 of FIG. 2, SPEED UP circuitry 26 supplies the speed-up signal via line 34 to REFERENCE HOLD ON circuitry 42. In turn, REFERENCE HOLD ON circuitry 42 supplies power to VOLTAGE REFERENCE circuit 36, via line 33. In the preferred embodiment of the present invention, the reference voltage generated is a band gap voltage.

The reference voltage is supplied to an NPN bias generation circuit 38, via line 37. In the preferred embodiment of the present invention NPN bias circuitry 38 forms a part of a series of current mirrors which are resident in the REFERENCE circuitry 22, the SWITCH/REGULATOR circuitry 24, and ERROR DETECTION circuitry 32, and which act as current sources therein. NPN bias circuitry 38 also supplies bias current to PNP bias circuitry 40, via line 39.

In turn, PNP bias circuitry 40 sets other bias current levels in REFERENCE circuitry 22, in TURN OFF DETECT circuit 28, and in ERROR DETECTION circuit 32. One of these bias currents is supplied, via line 41, to REFERENCE HOLD ON circuitry 42. This bias signal is used to generate a power signal which is applied via line 33 to maintain VOLTAGE REFERENCE circuitry 36 in an "on" condition.

A further bias current is supplied from PNP bias circuitry directly to VOLTAGE REFERENCE circuitry 36 by way of line 49. This also operates to maintain VOLTAGE REFERENCE circuitry in an "on" condition.

Another of the bias currents is applied via line 43 to TURN OFF DELAY circuitry 30. In response TURN OFF DELAY circuitry 30 supplies a signal to ON DETECT DISABLE circuit 44, via line 47. In turn, ON DETECT DISABLE circuit 44 supplies the disable signal, via line 31, to TURN ON DETECT circuit 20 to latch it into an "on" state as discussed above.

The bias current supplied by PNP bias circuitry 40 on line 45 sets current levels for use by a comparator in ERROR DETECTION circuit 32.

Finally, as discussed above, TURN OFF DELAY circuit 30 of REFERENCE circuitry 22 operates during the turn-off mode of switch 10 to supply the power to VOLTAGE REFERENCE circuit 36 while the high-current handling components in the switch are being turned off.

SWITCH/REGULATOR Circuitry 24

SWITCH/REGULATOR circuitry 24 includes OUTPUT DRIVER circuitry 46 which supplies the actual output on terminal 16 to the load; REGULATOR 48, which regulates and controls the output provided to the load by OUTPUT DRIVER circuitry 46; and DRIVE LOOP circuitry 50, which sets the output levels provided by OUTPUT DRIVER circuitry 46.

Both the REGULATOR circuitry 48 and the DRIVE LOOP circuitry 50 receive bias signals from NPN bias circuitry 38, via line 52. REGULATOR circuitry 48 utilizes this bias signal to set a reference voltage level against which the output from OUTPUT DRIVER circuitry 46 is compared.

DRIVE LOOP circuitry 50 employs positive feedback to boost the output current levels of OUTPUT DRIVER circuit 46 substantially above that which could be obtained if the bias signal were used to drive the OUTPUT DRIVER circuit 46 directly. Negative feedback is employed through the DRIVE LOOP circuitry 50 and REGULATOR circuitry 48 to stabilize the loop.

REGULATOR circuitry 48 controls the output level of OUTPUT DRIVER circuit 46 by applying signals on lines 56 and 57 to DRIVE LOOP circuitry 50 which are used as positive and negative feedback signals, respectively. These signals modify the driving signals supplied thereby to OUTPUT DRIVER circuitry 46.

In operation, initially, SWITCH/REGULATOR circuitry 24 receives a speed-up signal from SPEED UP circuitry 26 via line 58. DRIVE LOOP circuitry 50 responds to this speed-up signal by applying a drive signal to OUTPUT DRIVER circuitry 46. In turn, OUTPUT DRIVER circuitry 46 becomes operative, applying power to the load. It also applies signals to REGULATOR circuitry 48 via lines 60 and 61, which signals are proportional to the output current supplied to the load. REGULATOR circuitry 48 responds to these signals by applying positive and negative feedback signals, via lines 56 and 57 respectively, to DRIVE LOOP circuitry 50.

TURN OFF DETECT Circuitry 28

TURN OFF DETECT circuitry 28 of FIG. 2 detects the presence of a turn-off state in the control signal applied at terminal 12. TURN OFF DETECT circuitry 28 also responds to fault indications supplied from ERROR DETECTION circuitry 32. In response to the turn-off state or to selected ones of the fault indications TURN OFF DETECT circuitry 28 applies turn-off signals to the remainder of the blocks in the switch.

More specifically, in the turn-off mode, a turn-off signal is applied via line 62 to the REFERENCE HOLD ON circuitry 42 of REFERENCE circuit 22. This signal acts to remove the power being supplied to VOLTAGE REFERENCE circuitry 36 by REFERENCE HOLD ON circuitry 42.

A turn-off signal is also supplied to TURN OFF DELAY circuitry 30, via line 64. This signal acts to continue the application of power by PNP bias circuitry 40 to the VOLTAGE REFERENCE circuitry 36 for a predetermined amount of time following the initiation of the turn-off mode. This permits circuitry downstream of the REFERENCE circuit 22 to be fully discharged and turned off.

As discussed earlier, one of the problems encountered in the operation of a bipolar switch which is intended to be totally "off" in its "off" state, is the amount of time that different parts of the switch circuitry require to turn off. If all power were removed from the switch simultaneously upon initiation of a turn off mode, certain parts of the switch will remain in an "on" condition. For example, if PNP transistors are utilized which drive high current loads, the turn-off time for such devices is significant in comparison to the turn-off times for low level signal handling devices in the remainder of the circuit. If the switch is to be fully "off," enough time should be provided for discharging and turning off such PNP transistors before all power is removed.

During the turn-off mode, turn-off signals are also applied by TURN OFF DETECT circuitry 28 to the DRIVE LOOP circuitry 50 and REGULATOR circuitry 48, by way of lines 66 and 68 respectively. The turn-off signal on line 66 operates to disable the drive signals supplied by DRIVE LOOP circuitry 50 to OUTPUT DRIVER circuitry 46. The turn-off signal on line 68 activates output drive discharge circuitry which, in turn, operates to discharge OUTPUT DRIVER circuitry 46 by way of line 69.

During the turn-off mode, TURN OFF DETECT circuitry 28 supplies a disable signal on line 70 to SPEED UP circuitry 26 to prevent transients in the power source from initiating a false turn-on mode while the turn-off procedure is being implemented.

In operation, initially, TURN OFF DETECT circuitry 28 receives a speed-up signal from SPEED UP circuit 26 via line 72 which quickly brings TURN OFF DETECT circuitry 28 into operation. A bias current is supplied on line 45, as discussed above, to set the operating conditions in the circuit.

TURN OFF DETECT circuitry 28 receives a current level signal via line 74 from DRIVE LOOP circuitry 50 of SWITCH/REGULATOR circuitry 24. This signal is proportional to the level of current being supplied by OUTPUT DRIVER circuitry 46 and permits TURN OFF DETECT circuitry 28 to adjust the magnitude of the turn-off signal supplied on line 66 to driver bias circuitry 50 so that a quick and efficient disabling of driver bias circuitry 50 can be achieved.

TURN OFF DETECT circuitry 28 also receives a reference signal from VOLTAGE REFERENCE circuitry 36, via line 37. Internally, TURN OFF DETECT circuitry 28 compares this reference level against the control signal it receives at terminal 12 to determine whether a turn-off state is present in the control signal. In the preferred embodiment of the present invention the control signal can be provided from a logic gate which provides logic one and logic zero states. In the embodiment described herein, TURN ON DETECT circuitry 20 and TURN OFF DETECT circuitry 28 treat a logic one state as the turn-on state, and a logic zero state as a turn-off state.

ERROR DETECTION Circuitry 32

Referring now to the ERROR DETECTION circuitry 32 of FIG. 2, it can be seen that there are two functional blocks shown, an ERROR FLAG circuit 76 and a THERMAL SHUTDOWN circuit 78. Different fault conditions cause different turn-off conditions in the switch of the present invention.

Whenever ERROR FLAG circuitry 76 detects an over voltage condition, or when THERMAL SHUTDOWN circuitry 78 detects an overheating problem, each supplies an appropriate signal via line 64 to TURN OFF DETECT circuit 28 to initiate a turn-off mode of the switch. In this turn-off mode, the OUTPUT DRIVER circuitry 46 is turned off, the error flag is set, line 98, and the REFERENCE circuitry 22 remains "on" to supply power for the error flag.

Whenever a short to ground occurs, initially, only the error flag is set. However, if the shorted condition remains for an extended length of time, the THERMAL SHUTDOWN circuit 78 will become operative to cause the turn-off conditions described above.

Whenever a short of the output to the power source is detected, the error flag will be asserted and the reference voltage will be latched in the on-state to provide power for the error flag until the fault is corrected. Whenever the output is unloaded, only the error flag will be asserted and the switch will remain operative.

It can be seen from FIG. 2 that ERROR FLAG circuit 76 and THERMAL SHUTDOWN circuit 78 both receive a speed-up signal from SPEED UP circuitry 26 via lines 84 and 86, respectively. Bias current is received on line 52 from NPN bias circuitry 38 to set the operating conditions in the circuits.

ERROR FLAG circuitry 76 receives, via line 90, a signal representative of the magnitude of current being applied by OUTPUT DRIVER circuit 46 to the load. Error detect circuitry also receives, via line 16', the output voltage level supplied by OUTPUT DRIVER circuitry 46 to the load. Other signals received by error detect circuitry 76 include a signal on line 92 from TURN OFF DETECT circuit 28 which indicates the state of TURN OFF DETECT circuit 28—i.e. whether a turn-off state or selected fault has been detected; and a signal on line 94 from REFERENCE HOLD ON circuitry 42 which is indicative of a turn-off condition in REFERENCE circuitry 22.

ERROR FLAG circuitry 76 provides the error flag on line 98; an override signal to THERMAL SHUTDOWN circuitry 78 on line 80 during an over voltage condition.

THERMAL SHUTDOWN circuitry 78 supplies ERROR FLAG circuitry 76 with a bias signal on line 96 and a signal on line 82 which indicates an over-temperature condition. THERMAL SHUTDOWN circuitry 78 supplies an override signal to REFERENCE HOLD ON circuitry 42 during a thermal shutdown or over voltage condition to keep the REFERENCE circuitry in an "on" condition during such fault conditions.

Referring now to FIGS. 3A through 3F, the circuitry of the present invention will be described in greater detail.

FIGS. 3A and 3B, SPEED UP Circuitry 26

Referring now to FIGS. 3A and 3B, the SPEED UP circuitry 26 is shown enclosed in dashed lines labeled 26. As explained in greater detail in the above referenced copending patent application, when threshold detector circuitry 20 detects the presence of a turn-on state in the control signal, a current is provided through transistor 110 and diode-connected transistor 111. The base of transistor 118 is shown coupled to transistor 111 to form a current mirror such that the current flowing in transistor 118 is proportional to the current flowing in the collector of transistor 111. The current from transistor 118 flows through JFET 403 and, by way of line 27, out of the base of transistor 120, FIG. 3B. During the turn-on phase of the present invention, transistor 116, which is also connected to to transistor 118 by way of JFET 403, is in an "off" state.

In the preferred embodiment of the present invention, JFETs are used for breakdown protection of the various NPN devices in the various circuits therein. It is therefore to be understood that when JFETs are referred to herein they perform such a function.

Transistor 120 is a multiple collector transistor having an emitter and a base connected to the emitter and base, respectively, of multiple collector transistor 121. The emitters of transistors 120 and 121 are connected to terminal 14, the power source. Base drive to transistor pair 120 and 121 is provided on line 27 so as to cause currents which are proportional to one another to flow out of the various multiple collectors thereof.

One collector of transistor 120 is connected, via line 29, back to the TURN ON DETECT circuit 20 of FIG. 3A. In turn, the current flowing in line 29 is supplied to the collector of transistor 111 by way of JFET 402. This forms a positive feedback current loop which operates to maintain transistors 111 and 118 in a conductive state and to maintain current flow out of the various collectors of transistor pair 120 and 121. In the manner, turn-on threshold detector circuitry 20 is latched in an "on" state, which state is independent of the signal at terminal 12.

The TURN ON DETECT circuit of FIG. 3A differs slightly from that described in the referenced copending application. More specifically, the circuit described therein does not incorporate the positive feedback current loop described hereinabove. Instead, transistor $Q_{10}$, corresponding to transistor 110, operates into a load formed by series-connected resistors R5 and R6. Further, transistor $Q_{11}$ therein operates to implement hysteresis in the reference part of the circuit. In contrast herein, transistor 111 operates as a load to transistor 110 ($Q_{10}$) to generate drive current to transistors 120 and 121. In turn transistor 120 takes over the role of transistor 110 with respect to transistor 111, and being driven by a signal proportional to that flowing through transistor 111, completes a positive feed back current loop. In all other respects, the circuit of the above referenced copending application and the circuit of FIG. 3A herein, operate in the same manner.

FIG. 3B, REFERENCE Circuitry 22

As discussed earlier, the currents flowing out of SPEED UP circuitry 26 provide the initial turn-on signal to the various other blocks in the bipolar switch of the present invention. One of the collectors from transistor 121 supplies a speed-up signal to REFERENCE circuitry 22, via line 34. This signal is received by REFERENCE HOLD ON circuitry 42 at the base of transistor 129.

REFERENCE circuitry 22 receives power from the power source at terminal 14.

Transistor 129 couples power from the power source at terminal 14 to VOLTAGE REFERENCE circuitry 36 enclosed by dotted lines. VOLTAGE REFERENCE circuitry 36 is a standard band gap cell which provides a band gap reference voltage on line 37.

This reference voltage is supplied to NPN bias block 38 to generate a bias signals on line 52. NPN bias circuit 38 includes diode-connected transistor 140 and current mirror transistor 141. Transistor 141 supplies a bias current, via JFET 407, to PNP bias circuit 40. PNP bias circuit 40 includes diode-connected PNP transistor 146 and current mirror transistors 144 and 145.

Transistor 144 has multiple collectors, one of which supplies bias current to diode-connected transistor 147, a part of REFERENCE HOLD ON circuitry 42. Transistor 147 forms a part of a current mirror, the other part of which is transistor 124 of REFERENCE HOLD ON circuitry 42. The collector current from transistor 124 is applied through JFET 404 to drive diode-connected, multiple-collector transistor 123. The other collector of transistor 123 is connected to supply base drive to the base of transistor 129 so as to maintain transistor 129, and hence VOLTAGE REFERENCE circuit 36, in an operative condition.

Power is also supplied from PNP bias circuit 40 to VOLTAGE REFERENCE circuit 36 on line 49.

In this manner, upon receipt of a speed-up pulse from SPEED UP circuitry 26, the VOLTAGE REFERENCE circuit 36, the NPN bias circuit 38, the PNP bias circuit 40, and the REFERENCE HOLD ON circuitry 42, operate in a self sustaining manner to maintain VOLTAGE REFERENCE circuitry 36 in an operative condition.

As the REFERENCE circuitry 22 becomes operative, the speed-up signals from SPEED UP circuitry 26 become unnecessary. ON DETECT DISABLE circuitry 44 operates to disable the TURN ON DETECT circuitry 20 at this point. ON DETECT DISABLE circuitry 44 is actuated by current from one of the collectors of transistor 144, via line 43 by way of TURN OFF DELAY circuit 30.

In TURN OFF DELAY circuit 30, this current operates to turn on transistor 136. Current flowing out of the emitter of transistor 136 is supplied via line 47 to turn on transistors 143 and 142 of ON DETECT DISABLE circuit 44. Collector current flowing out of transistor 142 is supplied on line 31 to drive transistor 119 of TURN ON DETECT circuitry 20, FIG. 3A. This, in turn, causes transistor 119 and transistor 117 to disable the TURN ON DETECT circuitry 20.

More specifically, the collector and emitter of transistor 119 are connected across the base and emitter of transistor 111 and transistor 118. Similarly, the collector and emitter of transistor 117 are connected across the current mirror in the upstream end of the TURN ON DETECT circuit 20. When the signal from transistor 142 is applied to the bases of transistors 117 and 119, the upstream current mirror and transistors 111 and 118 are turned off.

Returning to FIG. 3B, transistors 143 and 142 of ON DETECT DISABLE circuitry 44, are connected to provide a short time delay to permit the REFERENCE circuitry 22 to stabilize before a disable pulse is issued. This time delay is achieved in the following manner. The current flowing out of the emitter of transistor 136 initially flows through resistor 516. Resistor 516 is connected across the base/emitter junction of transistor 143. Because transistor 143 and transistor 142 are initially "off", the base of transistor 142 will be at ground potential by way of resistor 517. As current flows through resistor 516, this current also flows into the emitter of transistor 142. This causes transistor 142 to turn on and collector current to be supplied out of transistor 142 on line 31. The time required for transistor 144 to begin conducting, and the time required for transistor 136 and resistor 516 to turn on transistor 142, contribute to the delay in issuing the disable pulse to TURN ON DETECT circuitry 20 on line 31.

As the voltage drop across resistor 516 reaches the turn-on threshold of transistor 143, transistor 143 turns on to regulate the base drive to transistor 142. Transistor 136 sets the current available to the emitter of transistor 143 and hence the amount of current which flows into resistor 517 from transistor 143. As the current through transistor 142 increases, the base drive to transistor 143 also increases. This causes transistor 143 to provide more current to resistor 517 and hence to remove base drive from transistor 142.

With respect to the other elements of ON DETECT DISABLE circuitry 44, FIG. 3B also shows that transistor 137 has an emitter which is connected via resistor 515 to the emitter of transistor 142, and a base which is connected to the base of transistor 142. This forms a current source which provides a current less than that flowing through transistor 142. The current level is set by the difference in the base/emitter voltages of transistors 137 and 142, as applied across resistor 515. As will be described further herein, transistors 137, 138, 139, 142 and 150 can be operated to discharge the base of transistor 136 over a delay period.

The above, and the remainder of the circuitry in REFERENCE circuitry 22 will be described in greater detail in connection with TURN OFF DETECT circuitry 28.

FIG. 3C, SWITCH/REGULATOR 24

Figure 3C:
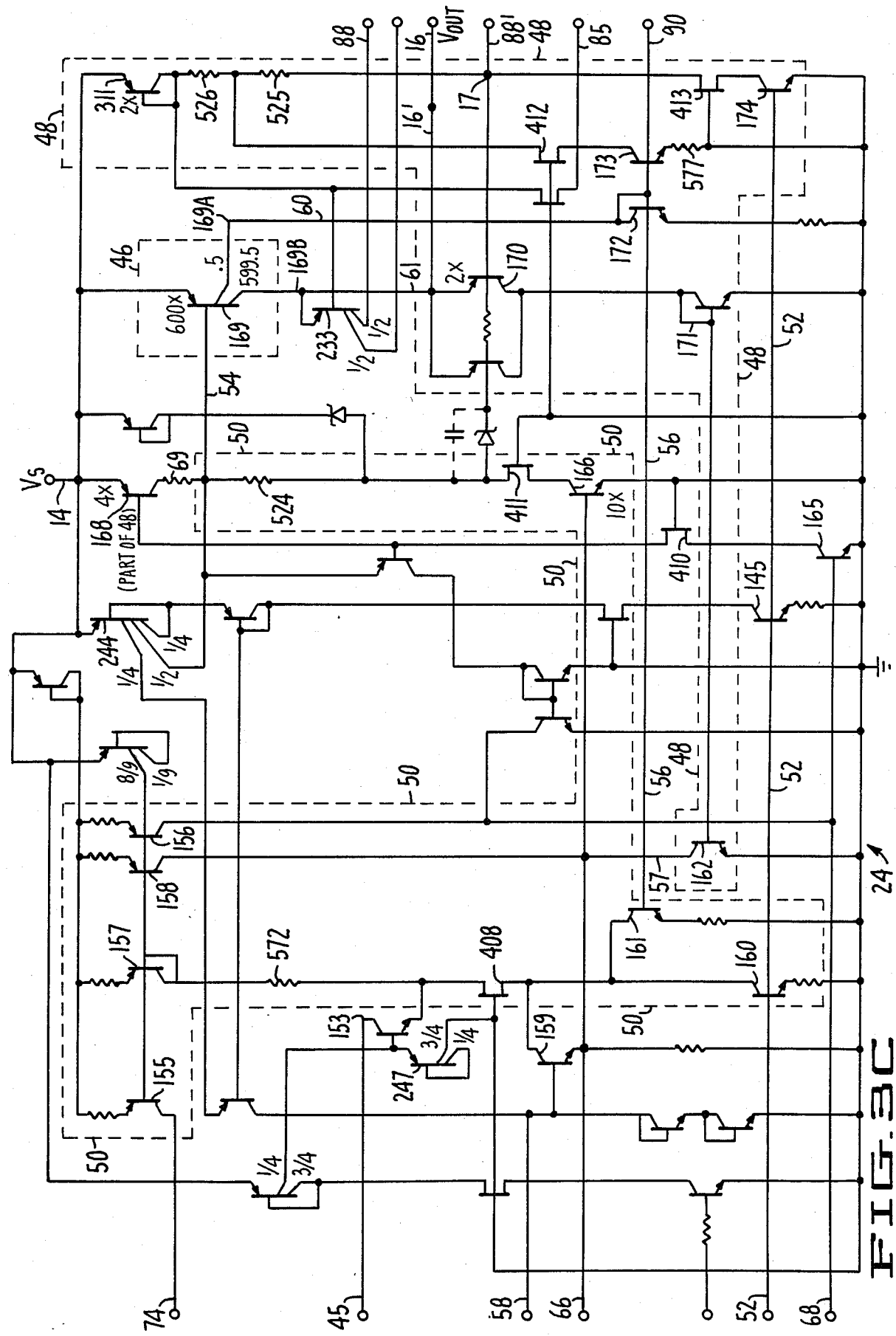
FIG. 3C is a detailed schematic of switch/regulator circuitry of the present invention.

Referring now to FIG. 3C, the actuation and operation of the SWITCH/REGULATOR circuitry 24 of the present invention will now be described in greater detail. The OUTPUT DRIVER 46, the DRIVE LOOP circuitry 50 and the REGULATOR circuitry 48, are shown enclosed in dashed lines.

The SWITCH/REGULATOR circuitry 24 receives power from the power source at terminal 14. The SWITCH/REGULATOR circuit 24 receives a speed-up signal on line 58 from SPEED UP circuitry 26, and a bias signal on line 52 from NPN bias circuitry 38, FIG. 3B.

The bias signal on line 52 is received at the base of transistor 160 of DRIVE LOOP circuitry 50. The collector current of transistor 160 is supplied to diode-connected PNP transistor 157. Transistor 157 is connected in a current mirror configuration with transistors 155, 156, and 158.

The speed-up signal on line 58 is applied to the base of transistor 159 which applies a pulse of current to transistor 157, in DRIVE LOOP circuitry 50, by way of JFET 408 and resistor 572. This pulse operates to place transistor 157 quickly into a conducting mode.

The collector of transistor 158 is connected to the base of transistor 166 to supply drive thereto. It is to be noted that the emitter of transistor 159, which provides the speed-up signal to the DRIVE LOOP circuitry 50, is also connected to the base of transistor 166 to turn on transistor 166 quickly.

The collector of transistor 166 is connected through JFET 411 and resistor 524 to the base of multiple collector PNP transistor 169 of the OUTPUT DRIVER circuitry 46. The current flowing through the collector of transistor 166 provides the drive signal to transistor 169. The emitter of transistor 169 is connected to terminal 14, the power source, while collector 169B thereof is connected to the output terminal 16.

Positive feedback is employed to boost the drive to transistor 169. This positive feedback includes the path from collector 169A of transistor 169 through the collector/base of diode-connected transistor 172, the base/collector of transistor 161, JFET 408, resistor 572, the base/collector of transistor 158, the base/collector of transistor 166, JFET 411, resistor 524, and finally the base of transistor 169.

This positive feedback will now be described in further detail. Starting at some arbitrary point in the loop, e.g. transistor 158, the current out of transistor 158 is supplied to transistor 166 where it is boosted by the gain of transistor 166. The boosted signal is then supplied from the collector of transistor 166 to the base of transistor 169. There, the signal is further boosted by the gain of transistor 169. Assuming, for example, a gain of 40 for transistor 166, a gain of 20 for transistor 169, and an initial current level at the base of transistor 166 of $i_o$, the current out of transistor 169 will be $800 i_o$.

Transistor 169 has two collectors, collector 169B which is connected to output terminal 17, and collector 169A which provides a current proportional to the current flowing in collector 169B. Assuming, for example, a ratio of 1:400 for collector 169A versus 169B, the current flowing out of collector 169A will be approximately $2 i_o$. The current out of collector 169A is mirrored via transistors 172 and 161 back to transistors 157 and 158. In turn, this current is now applied to the base of transistor 166 for reamplification through transistors 166 and 169. In this manner, positive feedback is used to boost what was originally a low level signal out of transistor 160, into a drive level which permits transistor 169 to provide a substantial current output.

When positive feedback is utilized in the above manner, a highly efficient driving configuration is obtained. For example, for an output current of 1.2 A, assuming a gain of 20 for transistor 169, and a gain of 40 for transistor 166, transistor 160 only need be operated at a collector current of approximately 10 microamps. In contrast, if a more conventional biasing scheme were utilized to drive transistor 169 to obtain a 1.2 A output, biasing circuitry would be required to run continuously at approximately 2 mA.

In order to stabilize the positive feedback operation of the SWITCH/REGULATOR circuitry 24 a negative feedback path from OUTPUT DRIVER circuitry 46 through REGULATOR circuit 48 to DRIVE LOOP circuitry 50 is employed. More specifically, transistor 170 is connected so that, as the current flowing out of collector 169B increases, it conducts more current into diode-connected transistor 171. In turn, this increased current is mirrored in the collector of transistor 162. As can be seen from FIG. 3C, transistor 162 is connected to draw away base drive from transistor 166. Thus, as the level of current out of transistor 169 increases, the negative feedback path through transistors 170, 172, and 162 operates to reduce the drive levels to transistor 166 and hence to reduce the current levels out of transistor 169.

In the preferred embodiment of the invention, the gain through the positive feedback path should be slightly lower than the gain through the negative feedback path; e.g. 2.0:2.1.

REGULATOR circuitry 48 in SWITCH/REGULATOR circuitry 24 provides voltage regulation of the switch output. Voltage regulation is achieved by providing a reference voltage against which the output signal at terminal 16 is compared. This reference voltage is derived from the bias signal on line 52. The bias signal is applied to the base of transistor 174 to set the level of current flowing through the collector of transistor 174. This current flows through series-connected JFET 413, resistor 525, resistor 526, and diode-connected transistor 311. The voltage provided by the series-connected resistors and diode provides a reference voltage at node 17. The voltage at node 17 is applied to the base of transistor 170 while the output voltage at terminal 16 is applied to the emitter of transistor 170.

The collector of transistor 170 is connected to diode-connected transistor 171 which forms a current mirror with transistor 162. In turn, the collector of transistor 162 is connected to the base of transistor 166. Thus, current flowing into the collector of transistor 162 draws away base drive to transistor 166. It can therefore be seen that as the difference between the voltages at terminal 16 and node 17 increases, transistor 170 is driven to cause drive current to be drawn away from transistor 166, and hence to decrease the base drive supplied to transistor 169. This, in turn, causes the voltage at terminal 16 to decrease, hence providing voltage regulation.

Voltage regulation to keep transistor 169 out of saturation is provided by way of transistor 173, JFET 412, and transistor 172. As discussed earlier hereinabove, diode connected transistor 172 is connected to collector 169A of transistor 169. In the preferred embodiment of the present invention collector 169A provides a current having a magnitude which is a small fraction of that flowing out of collector 169B. Collector 169A acts as a current sense terminal, while collector 169B acts as the output terminal. For example, the ratio of output current to sense current can be 599.5:0.5. Thus, any change in current in the output collector will be reflected, proportionally, in the sense collector.

As current from the sense collector is applied to diode-connected transistor 172, transistor 173 acts as a current mirror. Current into the collector of transistor 172 is drawn through resistor 526. This increases the voltage across resistor 526. Thus it can be seen that the current level through transistor 169 affects the reference voltage at node 17 formed by diode 311, resistor 526, and 525. As current demanded by the load out of collector 169B increases, this increase in current demand is mirrored proportionally in the current flowing through transistor 173. In turn, this causes a larger voltage to be dropped across resistor 526, thereby causing the reference voltage at node 17 to decrease. This, causes transistor 170 to turn on harder, which then causes base drive to be decreased to output driver transistor 169. In turn, this causes the collector 169B to operate at a greater voltage difference from the emitter of transistor 169. Thus, by reducing the reference voltage when increased current is demanded by the load, transistor 169 is kept out of saturation.

In the preferred embodiment of the present invention, the output impedance of the switch in its "on" state is approximately one ohm. In the "off" state the preferred embodiment of the present invention provides a substantially infinite output impedance, since there is essentially no standby current requirement.

The remainder of the circuitry in SWITCH/REGULATOR circuitry 24, FIG. 3, is directed to turn-on and turn-off modes, and will be discussed in further detail hereinbelow.

TURN OFF DETECT Circuitry, FIG. 3D

Referring now to FIG. 3D, the TURN OFF DETECT circuit 28 will now be described in greater detail.

It is to be understood that for purposes of the present invention, the presence of a turn-on as well as a turn-off state in the control signal applied at terminal 12 can be satisfactorily detected by TURN ON DETECT circuit 20 of FIG. 3A. However, the use of noise and stability margins. If TURN ON DETECT circuit 20 were desired to be used to detect both the turn-on state and the turn-off state, transistors 117 and 119 would be dispensed with.

TURN OFF DETECT circuitry 28 receives power from the power source at terminal 14. TURN OFF DETECT circuit 28 employs a conventional comparator design which utilizes transistor pair 180 and 181. The emitters of transistors 180 and 181 are connected together and are supplied with current from transistor 177. Transistor 177 and transistor 175 form a part of the current mirror string associated with PNP bias circuit 40, FIG. 3B.

Transistors 180 and 181 are both multiple collector transistors. One collector of each is loaded by way of transistors 185 and 186, which are connected as a current mirror. The comparator formed by the pair of transistors 180 and 181 receives one of its inputs at the base of transistor 181 via the emitter/base of transistor 182. The base of transistor 182 is connected through resistor 537 to terminal 12 so as to receive the control signal. The other input signal to the comparator is received at the base of transistor 180 by way of the emitter/base of transistor 179. This signal is the reference voltage, via line 37, supplied by VOLTAGE REFERENCE circuitry 36, FIG. 3B.

When the control signal at terminal 12 is greater than the magnitude of the reference voltage on line 37, i.e., a turn-on state is present in the control signal at terminal 12, transistor 181 is "off" and transistor 180 turns on. With transistor 180 in the "on" state, transistors 184 and 187 are also in an "on" state. These transistors when "on" disable turn-off signals to the SWITCH-/REGULATOR circuitry 24 and the REFERENCE circuitry 22.

As was discussed earlier, in the turn-off mode, TURN OFF DETECT circuitry 28 supplies a turn-off signal to the DRIVE LOOP circuitry 50 of the SWITCH-/REGULATOR circuitry 24, via line 66, and a turn-off signal to the REGULATOR circuitry 48 of the SWITCH/REGULATOR circuitry 24, on line 68. TURN OFF DETECT circuitry 28 supplies a turn-off signal to the REFERENCE HOLD ON circuit 42 of REFERENCE circuitry 22, via line 62. As can be seen from FIG. 3D, transistor 184 drives line 68, while transistor 187 controls transistor 191 to drive line 62, and controls transistor 189 to drive line 66.

When transistor 180 is "on", transistors 184 and 187 are also "on". Referring to FIGS. 3D and 3C, line 68, it can be seen that when transistor 184 is "on", transistor 165 in FIG. 3C will be held off. This is because the bias signal supplied by transistor 156 to transistor 165 is fully shunted to ground through transistor 184.

However, when transistor 184 is turned off, the bias signal from transistor 156 is applied to transistor 165 to drive transistor 165 into an "on" state. When transistor 165, FIG. 3C, is turned on, it cooperates with transistor 168 by way of JFET 410 to discharge the base/emitter junction of output driver transistor 169. It is to understood that this discharging of the base/emitter junction of transistor 169 occurs during the turn-off mode in conjunction with the removal of base drive to transistor 169.

Returning to FIG. 3D, transistor 189 is normally "off" when transistor 187 is on; i.e. during the "on" state of the switch. When a turn-off state is present in the control signal at terminal 12, transistor 181 turns on and transistor 180 turns off. When transistor 180 turns off, transistor 187 is disabled. At this point, current that was flowing through transistor 187 from line 74 is permitted instead to drive transistors 189, 190 and 191.

It is to be noted that the signal on line 74 originates from transistor 155 of FIG. 3C. As can be seen from FIG. 3C, the current flowing in transistor 155 is proportional to the bias signal being supplied to transistor 166, which provides the drive signal to transistor 169. It is also to be noted that line 66 is connected to the base of transistor 166. Thus, when transistor 189 turns on to drive line 66, the signal applied will be proportional to the bias current being supplied to transistor 166 of FIG. 3C. When transistor 189 is on, all of the bias current which would normally flow into the base of transistor 166 is instead shunted to ground, thus turning off transistor 166. In the above manner, when the transistor pair 180 and 181 detect the presence of a turn-off state in the control signal applied at terminal 12, the base drive to transistor 169 is disabled and the base/emitter junction of transistor 169 is discharged.

When a turn-off state is present in the control signal at terminal 12, and transistor 180 is turned off, thereby disabling transistor 187, transistor 188 also receives base drive from line 74. This causes transistor 188 to turn on and thereby hold or latch transistor 181 in an "on" condition.

Referring to transistor 190 of FIG. 3D, it can be seen that transistor 190 can shunt to ground, via line 58, the speed-up signal supplied by SPEED UP circuitry 26, FIG. 3B, to driver bias circuitry 50, FIG. 3C. Thus, when a turn-off mode is initiated, transistor 190 is turned on to prevent any speed-up signal from being supplied to the SWITCH/REGULATOR circuitry 24 which might prevent the switch from turning off.

Referring now to transistor 191 of FIG. 3D, and referring also to transistor 147 of FIG. 3B, it can be seen that transistor 191 is shunted across transistor 147 by way of line 62. Thus, when transistor 191 is turned on, the current mirror formed by transistors 147 and 124 is disabled. As discussed earlier, transistors 147 and 124 form a part of the REFERENCE HOLD ON circuit 42 which maintains the VOLTAGE REFERENCE circuitry 36 in an operative condition. Thus, when a turn-off state is detected in the control signal at terminal 12, transistor 191 is actuated to disable the REFERENCE HOLD ON circuitry 42 of REFERENCE circuitry 22.

Referring now to transistor 150 and line 64 in FIG. 3B, and transistor 180 and line 64 in FIG. 3D, it can be seen than when transistor 180 is in an "on" condition, the signal applied to line 64 causes transistor 150 to be in an "on" condition. From FIG. 3B it can be seen that transistor 150 is shunted across transistor 138. Transistor 138 forms a part of a current mirror with transistors 139 and 127. As discussed briefly above, these transistors along with transistors 136, 142 and 144 form a part of TURN OFF DELAY circuit 30.

When transistor 180 of FIG. 3D turns off, indicating the detection of a turn-off state in the control signal at terminal 12, transistor 150 is disabled. This causes the current mirror formed by transistors 138, 139 and 127 to become operative. Transistor 127 supplies base drive to transistor 128 which in turn speeds up the turn off of transistor 129, the transistor which supplies power to VOLTAGE REFERENCE circuitry 36. More specifically, transistor 127 pulls the base of transistor 129, and hence the base of transistor 128, and the collector of transistor 123 toward ground. Recall that when a turn-off mode is initiated, transistors 147 and 124 are turned off to remove base drive from transistor 123. Transistor 123 is thus turned off at this point. When the base of transistor 129, i.e. the base of transistor 128, reaches a point one base/emitter drop below the emitter of transistor 128, i.e. the base of transistor 133, transistor 128 turns on to quickly remove power from VOLTAGE REFERENCE circuit 36. Recall that the amount of current which flows into transistor 138, hence the amount of current which is mirrored in transistor 127, is set by the voltage drop across resistor 515. This current level is relatively small so that the discharging of the base of transistor 129 is not instantaneous. Thus, there is a period of time between the time base drive is removed from transistor 129 and the time when transistor 129 is turned off.

During this time, transistor 139, FIG. 3C, becomes operative to begin the removal of the drive to transistor 136. As a matter of background, transistor 136 drives transistor 142 which supplies the disable signal on line 31 to disable TURN ON DETECT circuit 20. It is desirable to maintain the TURN ON DETECT circuitry 20 in an disabled condition for a short period of time after the turn-off sequence is initiated. This prevents transients and other effects from turning the switch back on. Transistor 136 also provides the drive to transistors 188, 189, 190, and 191 in TURN OFF DETECT circuit 28 which transistors provide the turn-off signals to the rest of the switch. Thus, in the turn-off mode, the various portions of the switch are turned off in an ordered sequence, with the turn-off signal drivers, and the disable driver to TURN ON DETECT circuit 20, being the last portions to be de-energized.

The operation of TURN OFF DELAY circuitry 30 is interrelated with the operation of NPN bias circuit 38 and PNP bias circuit 40. As can be seen in FIG. 3B and PNP bias circuitry 40, one of the collectors of transistor 144 is connected via diode-connected transistor 305 to provide a drive signal to transistor 133 of the VOLTAGE REFERENCE circuitry 36. So long as the NPN bias circuit 38 and the PNP bias circuit 40 are operative, VOLTAGE REFERENCE circuitry 36 will remain in an "on" condition.

When transistor 150 is deactivated by the signal on line 64 the discharge path through diode-connected transistor 306 and transistor 127 is turned on. In turn, the current being supplied into the base of transistor 133 by diode-connected transistor 305 is shunted to ground through transistor 128. This causes the reference voltage supplied on line 37 to NPN bias circuit 38 to decrease, thereby causing the bias signal supplied by NPN bias circuit 38 on line 39 to NPN bias circuitry 40 to also decrease. In turn, this causes transistor 146, and hence transistor 144, to turn off. As transistor 144 turns off, the drive signal to transistor 133 of VOLTAGE REFERENCE circuitry 36 is decreased to zero as will the drive signal to transistor 136. This initiates the turn off delay.

In the preferred embodiment of the present invention, the total delay time, from the initiation of the turn-off mode to the completion of the turn-off delay, is approximately ten microseconds.

Even after transistor 144 has been turned off, transistor 136 remains in a conductive state for a period of time. This is because of the time it takes for transistor 139 to discharge the base of transistor 136. It is to be noted that the current flowing in transistor 139 is at reduced level from that flowing through transistor 138. This is due to resistor 519 in the emitter of transistor 139. This reduced current level and the parasitic capacitance at the base of transistor 136 determine the delay time. Thus, the disable signal to TURN ON DETECT circuit 20, and the drive signal to the turn-off transistors in TURN OFF DETECT circuit 28, will remain for a short time after the VOLTAGE REFERENCE circuitry 36, the NPN bias circuitry 38, and the PNP bias circuitry 40 are turned off.

Returning now to FIG. 3D, TURN OFF DETECT circuit 28 receives a speed-up signal from SPEED UP circuitry 26 on line 72. The speed-up signal on line 72 is supplied via diode-connected transistor 313 and resistor 527 to drive transistor 183 into an "on" state. In turn, current is drawn out of the base of transistor 180 via diode-connected transistor 312 and into the collector of transistor 183. This causes transistor 180 to be turned on and the TURN OFF DETECT circuitry 28 to be placed in an operative condition.

It is to be noted that transistor 177 supplies current in common to the emitters of transistors 180 and 181. Transistor 177 forms a part of a string of current mirrors driven by PNP bias circuitry 40 of FIG. 3B and connected together by line 45. When the SWITCH/REGULATOR circuitry 24 of FIG. 3C is first turned on, a speed-up pulse is supplied thereby onto line 45. Referring to FIG. 3C and transistors 153 and 247, it can be seen that the speed-up signal from SPEED UP circuitry 26 is initially applied to line 58 to drive transistor 159 into an "on" condition. A signal path is created for the initial speed-up pulse between line 45 and the collector of transistor 159 by way of the collector emitter of transistor 153 and JFET 408. This signal path operates to divert a portion of the speed-up pulse away from driver bias circuitry 50 so as to keep large spikes of current out of the current mirrors formed by transistors 157 and 158 to keep radio frequency interference out of the output of the switch. In the REFERENCE circuit 22, the current spike is used as a speed-up signal to the PNP bias circuitry 40 so as to rapidly place the circuitry into an operating condition.

Conversely, during the turn-off mode of the switch, the signal path on line 45 is used to turn off the various current sources connect to it. More specifically, when transistor 128 turns on to turn off VOLTAGE REFERENCE circuit 36, it also supplies base drive to transistor 178. In turn, transistor 178 turns on transistor 154. One collector of transistor 154 is connected to line 45. When transistor 154 turns on, it effectively removes base drive from all of the current sources connected to line 45. Thus, transistors 144, 146, and 145 of PNP bias circuit 40 are turned off, as are transistors 175 and 177 in TURN OFF DETECT circuit 28.

Error Detect Circuitry 32, FIG. 3E

Figure 3F:
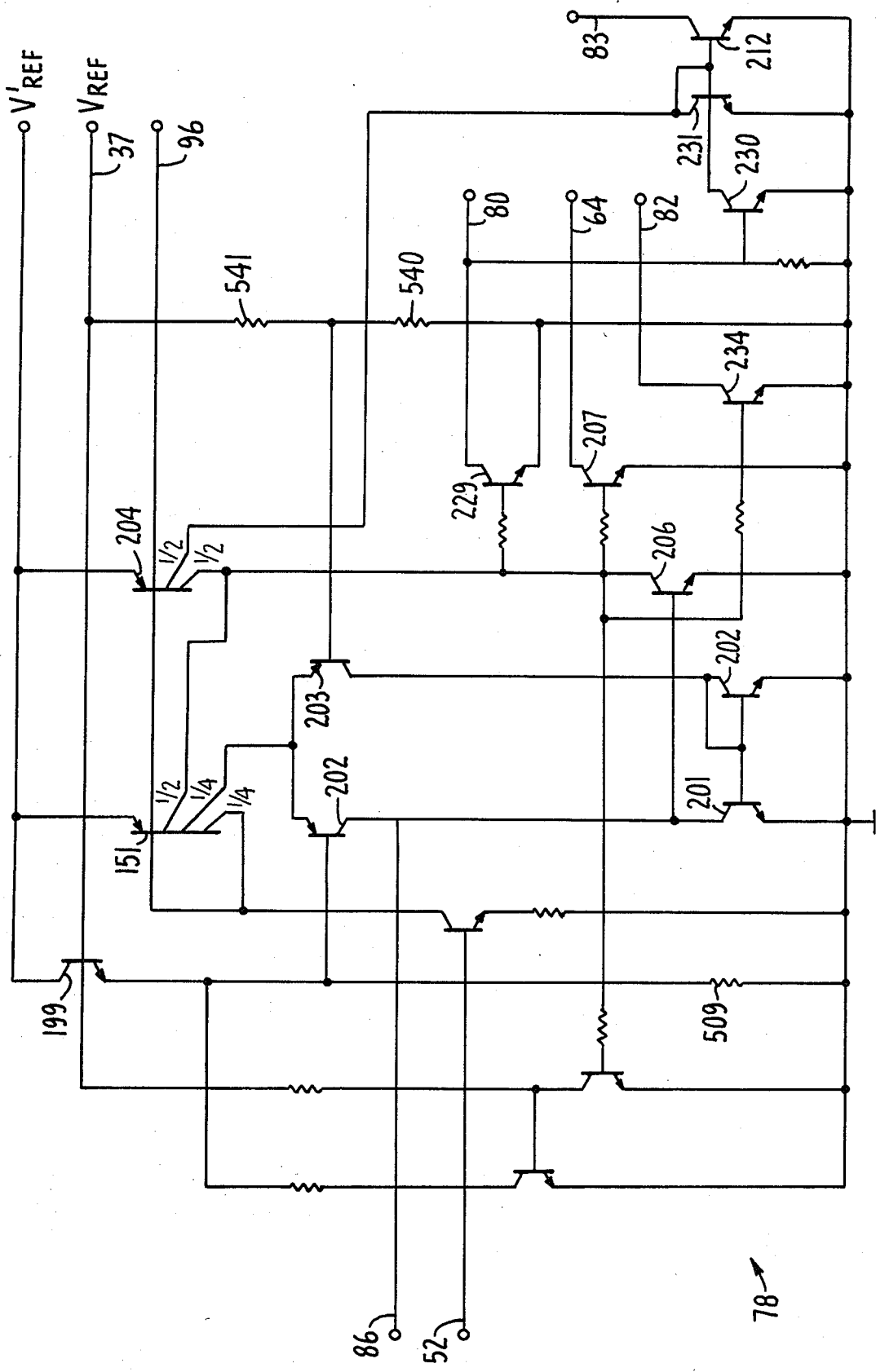
FIG. 3F is a detailed schematic of thermal shutdown circuitry of the present invention.

As discussed earlier, signals are supplied from error detect circuitry 32 to TURN OFF DETECT circuit 28 to cause the shut down of the bipolar switch of the present invention. These signals are supplied to TURN OFF DETECT circuit 28 on line 64. As can be seen from FIG. 3D and FIGS. 3E and 3F, the ERROR FLAG circuitry 76 and the THERMAL SHUTDOWN circuitry 78 each operate to disable transistors 184 and 187 of FIG. 3D. Transistor 227—FIG. 3E, and transistor 207 FIG. 3F, are both connected by way of line 64 to shunt base drive for transistors 184 and 187 to ground when certain fault conditions are detected. Transistor 227 operates when an over voltage condition is detected. Transistor 207 operates when an thermal shutdown occurs. As explained earlier, under these conditions, the OUTPUT DRIVER circuitry 46 is disabled, the error flag is set, and the REFERENCE circuitry 22 remains "on".

Transistor 227 of the ERROR FLAG circuitry in FIG. 3E is turned on when an over-voltage condition in the power source is detected. This condition is detected by way of diode connected transistor 320, zener structures 609, 610, 611 and 612, JFET 416, transistor 222, and resistors 544, 545 and 546, all of which are connected in series between the power source terminal 14 and ground. The collector of transistor 222 is connected to drive transistor 227 when the breakdown voltage of zener structures 609 through 612 is exceeded and current flows through transistor 222. When this occurs, transistor 242 is also turned on to sink current out of the collector of transistor 179, via line 80, and bring line 80 to near ground potential.

As can be seen from FIG. 3F, line 80 connects to the base of transistor 230. In turn, transistor 230, when "on", keeps the current mirror formed by transistors 231 and 212 in an "off" state. With line 80 brought to a ground potential, transistor 230 turns off and transistors 231 and 212 turn on. This permits current to flow along line 83 and into transistor 212. As can be seen from FIG. 3B, bottom left-hand corner, line 83 is connected to JFET 404 and diode connected transistor 123. Thus, line 83 acts as a current source to transistor 123 to keep in "on", even when transistor 124 has been shut off by a turn off signal on line 62 from TURN OFF DETECT circuit 28. This keeps the REFERENCE circuit 22 "on" to power the error flag, but permits the OUTPUT DRIVER circuit 46 to be shut off.

Line 80 is also brought to a ground potential by transistor 229, FIG. 3F, whenever a thermal shutdown condition is detected.

Transistor 207 of the THERMAL SHUTDOWN circuitry of FIG. 3F is turned on when a thermal shutdown condition is detected. More specifically, transistors 202 and 203 form a differential comparator pair. Transistor 203 receives a voltage at its base which is a fraction of the reference voltage on line 37 from VOLTAGE REFERENCE circuitry 36. A signal from transistor 199 is applied to the base of transistor 202. Transistor 199 is positioned in close proximity to output driver transistor 169. Thus, transistor 199 will be at substantially the same temperature as that of output driver transistor 169. As is well known in the art, the base/emitter voltage of a transistor changes with temperature. Transistor 199 has its base connected to receive the reference voltage on line 37, and has its emitter coupled to ground through resistor 509.

As the temperature of transistor 199 changes, the voltage applied to the base of transistor 202 changes. As the temperature of transistor 199 increases, the base/emitter voltage of transistor 199 decreases, and the voltage applied to the base of transistor 202 increases. This causes transistor 203 to turn on, and transistor 202 to turn off.

As a matter of background, when the operating temperature of output driver transistor 169 is at an acceptable level, transistor 202 will normally be "on" and transistor 203 normally will be "off". With transistor 202 normally "on", transistor 206 will normally be "on", thereby maintaining transistors 229, 207 and 234 in an "off" state. When transistor 202 turns off and transistor 203 turns on, transistor 206 is disabled thereby permitting transistors 229, 207 and 234 to be driven from current source transistor 204.

Returning to FIG. 3E, ERROR DETECTION circuitry 32 also supplies an error flag whenever a fault is detected. The error flag is supplied through transistor 225. An active low indicates that a fault has occurred. Transistor 225 is driven by a signal supplied by transistor 223. Transistor 223 is a part of a current mirror structure formed by transistors 239 and 214 of FIG. 3E, and transistors 204 and 151 of FIG. 3F.

When the switch is in an "on" state, the drive signal from transistor 223 to transistor 225 is diverted into transistor 224. Transistor 224 is maintained in an "on" condition by base drive supplied from transistor 214. Alternately, when a turn-off state is detected in the control signal at terminal 12, transistor 226—FIG. 3E, and transistor 232—FIG. 3B, turn on to shunt current drive away from transistor 225. Transistor 226 is driven under these circumstances by current on line 82 from transistor 181 — FIG. 3D. Transistor 232 is connected via line 94 to the base of transistor 225 and is turned on during the turn-off mode of TURN OFF DELAY circuitry 30.

Thus, both transistors 224 and 226 should be in an "off" condition if an error flag is to be asserted on line 98.

Transistor 224 will be disabled when either transistors 217 or 220 are turned on. Transistor 220 is turned on when the load is absent from output terminal 16. Transistor 217 is turned on when a current limit condition is detected.

Transistor 228, FIG. 3E, operates during an over voltage condition to disable transistor 226. More specifically, when transistor 228 is "on", it sinks base drive away from transistor 226. This turns transistor 226 off and the current flowing out of transistor 223 is permitted to flow into the base of transistor 225. Assuming that transistor 224 is off, this activates the error flag on line 98. During a thermal shutdown condition transistor 234, FIG. 3F, will be turned "on" to disable transistor 226 and to likewise activate the error flag on line 98.

ERROR FLAG circuitry 76, as discussed above, also detects the presence of a short circuit of the output terminal 16 to the supply terminal 14, a short circuit of the output terminal 16 to ground, and the loss of the load on output terminal 16.

The circuitry for detecting a short of the output terminal 16 to the power source terminal 14 can be found in FIGS. 3C and 3E. Transistor 233, FIG. 3C, is connected so that its emitter is tied to output terminal 16 and its base is tied to the collector/base of diode-connected transistor 311. In this manner, should the output terminal 16 be shorted to the power source terminal 14, current will flow out of the collectors of transistor 233. One collector of transistor 233 is connected to the base of transistor 129, thus latching the reference circuit in the on-state until the short is removed. The other collector of transistor 233 is connected to the base of transistor 238 in FIG. 3E, via line 88. When current flows into the base of transistor 238, transistor 238 is turned on to turn off transistor 226. Transistor 237 is connected to shunt the base drive away from transistor 238 when transistor 180, FIG. 3D, is "on". Recall that transistor 180 will be "on" in the absence of a fault condition or a turn-off state in the control signal at terminal 12. As discussed above, when transistor 226 is turned off, the error flag on line 98 can be set to indicate an error.

The circuitry for detecting a current limit condition can be found in FIG. 3E. Transistors 209 and 210 have their collectors and bases tied together and share current from transistor 208. Transistor 208 receives a bias signal from NPN bias circuitry 38, FIG. 3C. The emitter of transistor 209 is coupled through diode-connected transistor 319 to output terminal 16. As such, the emitter of transistor 209 is one diode drop below the voltage at output terminal 16. The emitter of transistor 210 is coupled to the emitter of transistor 211. The collector of transistor 211 is connected to the base of transistor 213, and the base of transistor 211 is connected to node 17, FIG. 3C, via line 88'. Recall that the voltage at node 17 serves as a reference to the REGULATOR circuitry 48 of SWITCH/REGULATOR circuitry 24. Also recall that current regulation in the SWITCH/REGULATOR circuitry 24 is achieved by modifying the voltage at node 17 as a function of the current flowing out of driver transistor 169.

It can therefore be said that if the voltage at terminal 16 drops below the voltage at node 17 current limiting is taking place. In other words, the REGULATOR circuitry 48 is unable to adjust the drive to output driver transistor 169 so as to keep the output voltage at terminal 16 above the voltage level at node 17. From FIG. 3E it can be seen that normally transistor 209 will be "on" and transistor 210 will be "off" when terminal 16 has a voltage greater than that at node 17. Transistor 211 under these circumstances will be off. However, when the voltage at terminal 16 falls below that at node 17, transistor 209 turns off and transistor 210 turns on. With current now available through transistor 210, transistor 211 will turn on to thereby drive multiple collector transistor 213 into an "on" state.

One of the collectors of transistor 213 provides a drive signal to transistor 217. In turn, transistor 217, when "on", disables transistor 224. Transistor 224, when "on", shunts current drive away from transistor 225, the error flag driver. Thus, by turning off transistor 224, the error flag can be asserted.

The circuitry for detecting the absence of a load at terminal 16 can be found in FIGS. 3C and 3E. As discussed earlier, the current flowing out of collector 169A of output driver transistor 169, is proportional to the current being supplied out of collector 169B to output terminal 16. Collector 169A is coupled to a current mirror formed by transistors 172, 173 and also transistor 216. Transistor 216 is coupled to the base of transistor 172 by way of line 90. As the current provided to terminal 16 goes to zero, so will the current provided out of collector 169A. This decreasing current is reflected in the current flowing through the collector of transistor 216 in FIG. 3E. The collector current in transistor 216 drives transistor 215, which in turn supplies current to current mirror transistors 218 and 219.

Where a load is absent on output terminal 16, no current will flow out of collector 169B or out of collector 169A. In turn, this causes transistor 216, transistor 215, transistor 218, and transistor 219 to turn off. In turn, this causes a current, which formerly flowed into the collector of transistor 219, to flow into the base of transistor 220. This turns transistor 220 on and disables transistor 224. As described above, when transistor 224 is disabled, and in the absence of a turn-off mode, the error flag will be asserted on line 98.

The terms and expressions which are used herein are used as terms of description and not of limitation, and there is no intention in the use of such terms and expressions of limiting the scope of the claims herein or the embodiments shown.

I claim:

1. A solid state apparatus responsive to a control signal for supplying power from a power source to a load comprising:

detect means having an input coupled to receive the control signal for detecting the presence of a turn on state in the control signal and an output for producing an actuate signal at said output, said detect means including circuitry for performing said detect means function that is powered initially solely from the control signal; and supplying means coupled between the power source and the load and having an input responsive to the actuate signal for supplying power to the load, said supplying means including means for switching from an "off" state to an "on" state in response to said actuate signal, and wherein said supplying means requires no quiescent bias current in the "off" state.

2. The solid state apparatus of claim 1 wherein said supplying means further comprises:

reference means having an input responsive to the actuate signal, said reference means including circuitry operative to provide reference voltage signals; and control means responsive to said reference voltage signals and coupled to the power source and to the load for controlling the power applied to the load.

3. The solid state apparatus of claim 2 wherein said actuate signal is present for the duration of a period of time and is removed after the period of time and further wherein said reference means include:

actuating means coupled to the power source and operative for generating the reference voltage signals;

first means responsive to the actuate signal for actuating the generation of the reference voltage signals for the duration of the actuate signals; and sustaining means having an input responsive to the reference voltage signals and having an output coupled to the first actuating means for maintaining the reference voltage signals following the removal of said actuate signal.

4. The solid state apparatus of claim 2 or 3 wherein said controlling means comprise driving means coupled between the power source and the load and actuatable into an operative condition for applying the power to the load;

second means responsive to the reference signals for actuating the driving means; and feedback means coupled to the driving means and responsive to the operative condition of the driving means for maintaining the driving means in an operative condition.

5. The solid state apparatus of claim 4 wherein said driving means comprise means coupled to the second actuating means for generating a drive signal; and output driver means responsive to the drive signal for supplying power to the load;

wherein the feedback means comprise means coupled to the output driver means for applying a positive feedback signal to the drive signal generating means, and further wherein the drive signal generating means include means responsive to the positive feedback signal for amplifying the positive feedback signal and supplying the amplified positive feedback signal as the drive signal to the output driver means.

6. The solid state apparatus of claim 5 wherein said feedback means further include means coupled between the output driver means and the drive signal generating means for providing a negative feedback signal to the output driver means.

7. The solid state apparatus of claim 4 wherein the reference means and the driving means each have an intrinsic start up time and further wherein said first and second actuating means inject a momentary speed-up signal into each of the reference means and the driving means respectively so that the reference means and the driving means are brought into operation over a period substantially shorter than the intrinsic start-up time.

8. The solid state apparatus of claim 4 wherein the control signal includes a turn-off state, further including means responsive to the turn-off state for de-energizing the reference means and the regulating means.

9. The solid state apparatus of claim 8 wherein the de-energizing means include
means coupled to receive the control signal and responsive to the turn-off state therein for generating de-energizing signals; and
means coupled to the sustaining means and the feedback means and responsive to the de-energizing signals for disabling the sustaining means and the feedback means.

10. The solid state apparatus of claim 9 further including
means coupled to the reference signal generating means for maintaining the reference means in an operative condition for a predetermined amount of time after the sustaining means are disabled by the disabling means; and
means coupled to the driving means and responsive to the de-energizing signal for deactivating the driving means.

11. The solid state apparatus of claim 9 further including means for providing an error flag whenever a fault condition occurs during the operation of the solid state apparatus.

12. The solid state apparatus of claim 11 further including means responsive to an over voltage fault condition in the solid state apparatus for disabling the driving means when the over voltage fault condition is present.

13. solid state apparatus of claim 11 further including means responsive to an overheating fault condition in the solid state apparatus for disabling the driving means when the overheating fault condition is present.

14. A monolithic bipolar switch responsive to a control signal for supplying power from a power source to a load comprising:
detect means having an input coupled to receive the control signal for detecting the presence of a turn on state in the control signal and an output for producing a speed-up signal at said output, said detect means including circuitry for performing said detect means function that is powered initially solely from the control signal;
supplying means coupled between the power source and the load and having an input responsive to the speed-up signal for supply power to the load, said supplying means includes means for switching from an "off" state to an "on" state in response to the speed-up signal and wherein said supplying means does not require standby current in the "off" state, and further wherein said supplying means comprise:
drive signal means for generating a drive signal having a controlled magnitude output;
output means responsive to said drive signal for applying power to the load;
feedback means coupled between the output means and the drive signal means for providing positive feedback to the drive signal means so that the magnitude of the drive signal is increased as a function of the positive feedback signal; and
disabling means coupled to the supplying means responsive to a turn-off state in the control signal for disabling the supplying means, wherein said disabling means include:
discharge means for de-energizing the output means; and
turn-off delay means for supplying power to the discharge means while the output means is being de-energized.

15. A method in a solid state apparatus for supplying power from a power source to a load in response to a control signal comprising the steps of:
detecting the presence of a turn on state in a control signal and generating an actuate signal, including the step of initially deriving power for detecting the turn-on state solely from the control signal; and
supplying power to the load in response to the actuate signal using supplying means which switch from an "off" state to an "on" state when said actuate signal is applied, and further wherein said supplying means requires no quiescent bias current in the "off" state.

16. The method of claim 15 wherein the power supplying step comprises the steps of
providing reference signals in response to the actuate signal from reference means; and
controlling the application of power to the load in response to the reference signals.

17. The method of claim 16 wherein said actuate signal has a predetermined duration and said reference signal providing step includes the further steps of:
configuring the reference means to be actuatable from an "off" condition to an operative condition;
actuating the reference means in response to the actuate signal for the duration of the actuate signal; and
maintaining the reference means in an operative condition by way of sustaining means which are responsive to the reference signals.

18. The method of claim 16 or 17 wherein said controlling step comprises the steps of:
applying the power to the load by way of driving means coupled between the power source and the load which produce controlled output levels and which are actuateable from an "off" condition to an operative condition;
actuating the driving means by way of second means responsive to the reference signals; and
boosting the output levels of the driving means by way of feedback means coupled to the driving means and responsive to the operative condition of the driving means.

19. The method of claim 17 wherein said reference signal providing step comprises the steps of generating a reference voltage by way of reference generating means; and providing bias signals in response to the reference voltage;

wherein the actuating step includes the step of supplying power to the reference voltage generating means for the duration of the actuate signal; and further wherein the sustaining means providing step includes the step of applying a sustaining signal to the first actuating means so that said first actuating means remain operative in the absence of the actuate signal.

20. The method of claim 18 wherein said driving means comprise drive bias means coupled to the second actuating means for generating a drive bias signal, and output driver means responsive to the drive bias signal for supplying power to the load, and further wherein the maintaining step includes the step of applying a positive feedback signal to the drive bias means, so that the drive bias means remain operative independently of the second actuating means and boost the magnitude of the drive bias signal.

21. The method of claim 15 wherein the supplying means have an intrinsic start-up time and further wherein the supplying step includes the step of applying momentary speed-up signals to the supplying means so that the supplying means are brought into operation over a period of time substantially shorter than the intrinsic start-up time.

* * * * *